(12) United States Patent
Han

(10) Patent No.: US 11,410,723 B2
(45) Date of Patent: Aug. 9, 2022

(54) SEMICONDUCTOR DEVICE AND METHOD OF OPERATING THE SAME

(71) Applicant: SK hynix Inc., Icheon (KR)

(72) Inventor: Jae Hyun Han, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/210,165

(22) Filed: Mar. 23, 2021

(65) Prior Publication Data

US 2022/0101919 A1  Mar. 31, 2022

(30) Foreign Application Priority Data

Sep. 25, 2020  (KR) .......................... 10-2020-0124999

(51) Int. Cl.
  *G11C 11/00*  (2006.01)
  *G11C 13/00*  (2006.01)
  *G11C 11/16*  (2006.01)

(52) U.S. Cl.
  CPC ...... *G11C 13/0069* (2013.01); *G11C 11/1673* (2013.01); *G11C 11/1675* (2013.01); *G11C 13/004* (2013.01); *G11C 13/0004* (2013.01); *G11C 2013/0052* (2013.01); *G11C 2013/0092* (2013.01)

(58) Field of Classification Search
  CPC ............ G11C 13/0069; G11C 13/0004; G11C 11/1673; G11C 11/1675
  USPC .......................................................... 365/163
  See application file for complete search history.

(56) References Cited

U.S. PATENT DOCUMENTS

| 5,873,113 A | * | 2/1999 | Rezvani ............. G11C 16/3468 365/185.22 |
| 10,134,470 B2 | | 11/2018 | Tortorelli et al. |
| 10,381,075 B2 | | 8/2019 | Totorelli et al. |

* cited by examiner

*Primary Examiner* — Vu A Le

(57) ABSTRACT

Provided herein may be a method of operating a semiconductor device including memory cells each storing multi-bit data. The method includes receiving data that is to be programmed in a memory cell selected from the memory cells; and applying a program pulse to the selected memory cell, the program pulse being determined depending on a logic state of the data and being selected from a group including a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse.

20 Claims, 15 Drawing Sheets

SEMICONDUCTOR DEVICE AND METHOD OF OPERATING THE SAME

CROSS-REFERENCE TO RELATED APPLICATION

The present application claims priority under 35 U.S.C. § 119(a) to Korean patent application number 10-2020-0124999, filed on Sep. 25, 2020, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device including a memory.

2. Related Art

Recently, with requirement of miniaturization, low power consumption, high performance, and diversification of electronic apparatuses, semiconductor devices configured to store information are needed in various electronic apparatuses such as computers and portable communication apparatuses. Therefore, there has been research on semiconductor devices configured to store data using characteristics of switching between different resistance phases depending on applied voltage or current. Examples of such semiconductor devices include a resistive random access memory (RRAM), a phase-change random access memory (PRAM), a ferroelectric random access memory (FRAM), a magnetic random access memory (MRAM), an E-fuse, and so forth.

SUMMARY

Various embodiments of the present disclosure are directed to a semiconductor device capable of improving operating characteristics and reliability of a memory cell therein.

An embodiment of the present disclosure may provide for a method of operating a semiconductor device including memory cells each storing multi-bit data, the method including receiving data that is to be programmed in a memory cell selected from the memory cells; and applying a program pulse to the selected memory cell, the program pulse being determined depending on a logic state of the data and being selected from a group including a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse.

An embodiment of the present disclosure may provide for a semiconductor device, including a cell array including memory cells that each store multi-bit data; a voltage generator configured to generate a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse; and a control logic circuit configured to receive data that is to be programmed into a memory cell selected from the memory cells, and to apply a program pulse to the selected memory cell to perform a program operation, the program pulse being determined depending on a logic state of the data and being selected from among the first to fourth program pulses.

An embodiment of the present disclosure may provide for a method of operating a semiconductor device including memory cells, the method including receiving data to be programmed in a memory cell selected from the memory cells; and applying a program pulse to the selected memory cell, the program pulse being determined depending on a logic state of the data and being selected from a group including a first program pulse having a positive polarity and a second program pulse having a negative polarity and having at least one of a peak level, a peak period, and a slew rate different from those of the first program pulse.

An embodiment of the present disclosure may provide for a semiconductor device, including a cell array including memory cells; a voltage generator configured to generate a first program pulse having a positive polarity and a second program pulse having a negative polarity and having at least one of a peak level, a peak period, and a slew rate different from those of the first program pulse; and a control logic circuit configured to receive data that is to be programmed into a memory cell selected from the memory cells, and to apply a program pulse to the selected memory cell to perform a program operation, the program pulse being determined depending on a logic state of the data and being selected from among the first and second program pulses.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Figure 1:
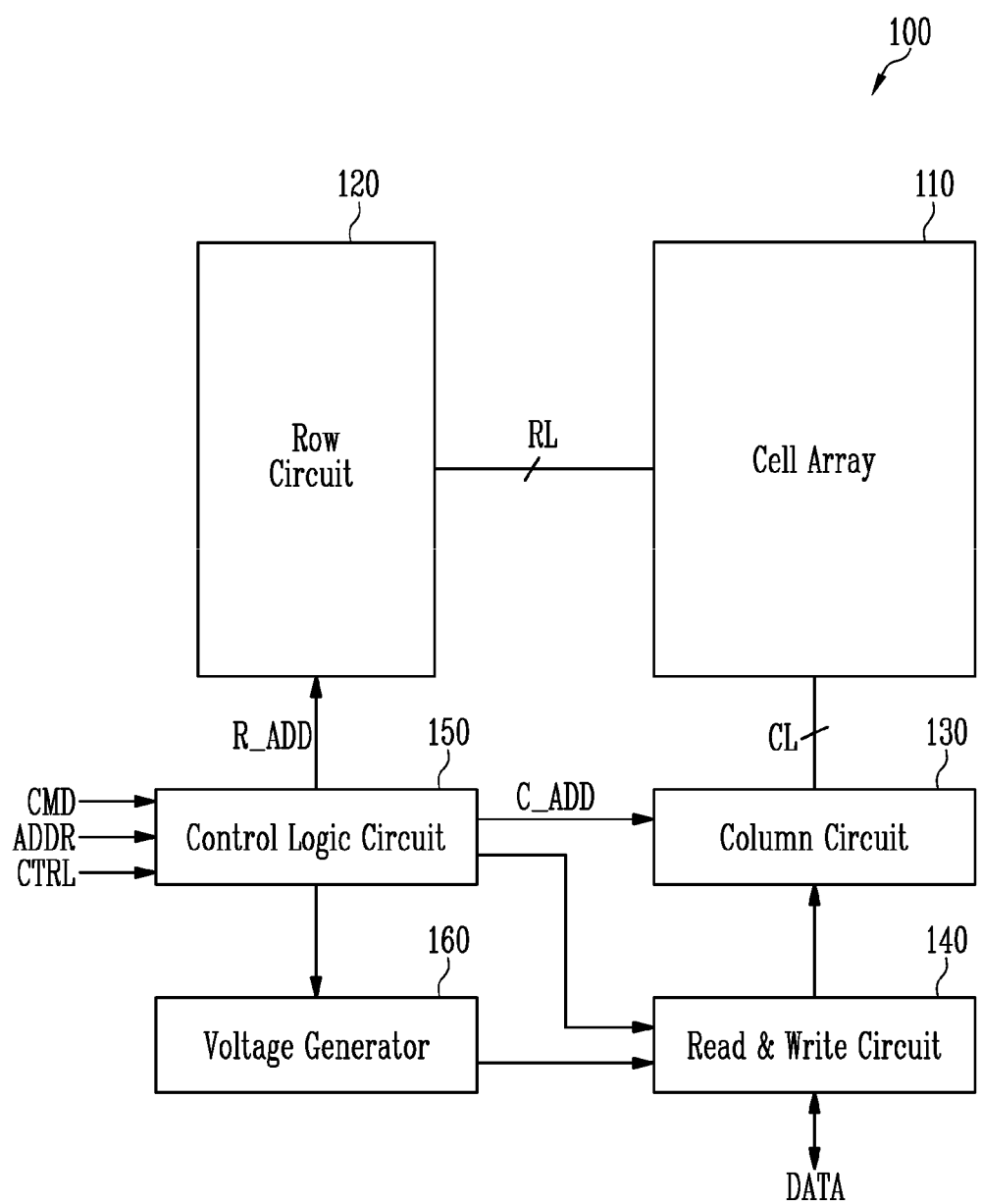
FIG. 1 illustrates a block diagram of a semiconductor device in accordance with an embodiment of the present disclosure.

FIG. 1 illustrates a block diagram of a semiconductor device 100 in accordance with an embodiment of the present disclosure.

Referring to FIG. 1, the semiconductor device 100 may include a cell array 110, a row circuit 120, a column circuit 130, a read and write circuit 140, a control logic circuit 150, and a voltage generator 160.

The semiconductor device 100 may communicate with a controller (not shown). When a read/write request is received from a host, the controller may control the semiconductor device 100 to write data to the semiconductor device 100 or read data stored in the semiconductor device 100. To this end, the controller may provide an address ADDR, a command CMD, and a control signal CTRL to the semiconductor device 100. Data DATA may be transmitted and received between the controller and the semiconductor device 100.

The cell array 110 may be coupled to the row circuit 120 through row lines RL and coupled to the column circuit 130 through column lines CL. The cell array 110 may include memory cells, and the memory cells may be coupled between the row lines RL and the column lines CL. The row lines RL may be word lines and the column lines CL may be bit lines, or the row lines RL may be bit lines and the column lines may be word lines. Each of the memory cells may include a variable resistance layer. Each of the memory cells may store multi-bit data or single-bit data.

The control logic circuit 150 may be coupled to the row circuit 120, the column circuit 130, the read and write circuit 140, and the voltage generator 160. The control logic circuit 150 may control the row circuit 120, the column circuit 130, the read and write circuit 140, and the voltage generator 160 to perform an internal operation according to the command CMD received from the controller.

When the command CMD, the address ADDR, and the control signal CTRL are received from the controller, the control logic circuit 150 may provide an operation control signal to the read and write circuit 140 and provide a voltage generation control signal to the voltage generator 160. Furthermore, the control logic circuit 150 may provide a row address R_ADD to the row circuit 120, and may provide a column address C_ADD to the column circuit 130.

A row circuit 120 may be a row decoder, a word line decoder, a word line driver, or the like. The row circuit 120 may decode the row address R_ADD and select the row line RL according to the decoded row address. The column circuit 130 may be a column decoder, a bit line decoder, a bit line driver, or the like. The column circuit 130 may decode the column address C_ADD and select the column line CL according to the decoded column address.

The voltage generator 160 may generate an operating voltage according to the voltage generation control signal, and may supply the generated operating voltage to the read and write circuit 140. The operating voltage may include a program pulse, a read pulse, etc. The voltage generator 160 may generate a plurality of program pulses. The plurality of program pulses may have different waveforms according to a logic state of data to be programmed in a selected memory cell. The program pulses may have one or more of different polarities, peak levels, peak periods, slew rates, and slew periods.

In an embodiment, the voltage generator 160 may generate a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse.

In another embodiment, the voltage generator 160 may generate a first program pulse having a positive polarity and falling at a first slew rate, a second program pulse having the positive polarity and falling at a second slew rate less than the first slew rate, a third program pulse having a negative polarity and rising at a third slew rate, and a fourth program pulse having the negative polarity and rising at a fourth slew rate less than the third slew rate.

In still another embodiment, the voltage generator 160 may generate a first program pulse having a positive polarity, and a second program pulse having a negative polarity and having at least one of a peak level, a peak period, and a slew rate different from those of the first program pulse.

In still another embodiment, the voltage generator 160 may generate a first program pulse having a positive polarity and falling at a first slew rate, and a second program pulse having a negative polarity and rising at a slew rate different from the first slew rate.

If a program command is received from the controller, the control logic circuit 150 may control the read and write circuit 140 to select one of multiple program pulses according to a logic state of data DATA to be programmed and to apply the selected program pulse to a selected memory cell, thereby performing a program operation. During the program operation, the read and write circuit 140 may transmit, to the column line CL, data DATA received from an input/output circuit (not shown), and the selected memory cell may be programmed according to the transmitted data DATA. Here, the data DATA may be multi-bit data or single-bit data to be programmed to the selected memory cell.

Figure 2:
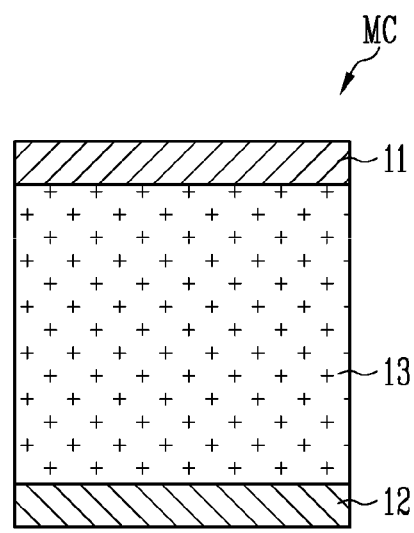
FIG. 2 illustrates a cell structure of a semiconductor device in accordance with an embodiment of the present disclosure.

FIG. 2 illustrates a cell structure of a semiconductor device in accordance with an embodiment of the present disclosure.

Referring to FIG. 2, the semiconductor device may include a memory cell MC. The memory cell MC may include a first electrode 11, a second electrode 12, and a variable resistance layer 13. The memory cell MC may serve as both a data storage device and a selection device.

The variable resistance layer 13 may be located between the first electrode 11 and the second electrode 12. The variable resistance layer 13 may include a resistive material, and have characteristics of making a reversible transition between different resistance states depending on a voltage or current applied thereto.

In an embodiment, the variable resistance layer 13 may include a transition metal oxide, or include a metal oxide such as a perovskite-based material. Hence, data may be stored in the memory cell MC by generating or removing an electrical path in the variable resistance layer 13.

In an embodiment, the variable resistance layer 13 may have a magnetic tunnel junction (MTJ) structure. The variable resistance layer 13 may include a magnetization pinned layer, a magnetization free layer, and a tunnel barrier layer. The tunnel barrier layer may be interposed between the magnetization pinned layer and the magnetization free layer. For example, the magnetization pinned layer and the magnetization free layer may include a magnetic material. The tunnel barrier layer may include an oxide of magnesium (Mg), aluminum (Al), zinc (Zn), titanium (Ti), or the like. Here, a magnetization direction of the magnetization free layer may change depending on a spin torque of electrons in a current applied thereto. Therefore, depending on a change in the magnetization direction of the magnetization free layer with respect to a magnetization direction of the magnetization pinned layer, data may be stored in the memory cell MC.

In an embodiment, the variable resistance layer 13 may include a phase change material and may include chalcogenide. The variable resistance layer 13 may include chalcogenide glass, chalcogenide alloy, or the like. The variable resistance layer 13 may include silicon (Si), germanium (Ge), antimony (Sb), tellurium (Te), bismuth (Bi), indium (In), tin (Sn), selenium (Se), or a combination thereof. In an embodiment, the variable resistance layer 13 may have a Ge—Sb—Te (GST) structure, and be formed of $Ge_2Sb_2Te_5$, $Ge_2Sb_2Te_7$, $Ge_1Sb_2Te_4$, or $Ge_1Sb_4Te_7$. The variable resistance layer 13 may change a phase in a program operation. The variable resistance layer 13 may have a low resistance crystalline state by performing a set operation. The variable resistance layer 13 may have a high resistance amorphous state by performing a reset operation. Hence, data may be stored in the memory cell MC using a difference in resistance according to the phase of the variable resistance layer 13.

In an embodiment, the variable resistance layer 13 may include a variable resistance material whose resistance is changed without a phase change, and may include a chalcogenide-based material. The variable resistance layer 13 may include germanium (Ge), antimony (Sb), tellurium (Te), arsenic (As), selenium (Se), silicon (Si), indium (In), tin (Sn), sulphur (S), gallium (Ga), or a combination thereof. In an embodiment, the variable resistance layer 13 may include $As_2Te_3$, $As_2$, $As_2Se_3$, or the like.

The variable resistance layer 13 may have one phase, and the phase may be maintained during the program operation. In an embodiment, the variable resistance layer 13 may have a chalcogenide-based layer that maintains the amorphous state. The variable resistance layer 13 has the amorphous state, and is not changed to the crystalline state during the program operation. Thus, a threshold voltage of the memory cell MC may be changed according to a program voltage applied to the memory cell MC, and the memory cell MC may be programmed in one of two states. When a negative program voltage is applied to the memory cell MC, the variable resistance layer 13 has a high resistance amorphous state. When a positive program voltage is applied to the memory cell MC, the variable resistance layer 13 has a low resistance amorphous state. Hence, data may be stored in the memory cell MC using a difference in resistance of the variable resistance layer 13.

The first electrode 11 or the second electrode 12 may be electrically coupled to a bit line or a word line. The first electrode 11 may be electrically coupled to the bit line, and the second electrode 12 may be electrically coupled to the word line. Alternatively, the first electrode 11 may be electrically coupled to the word line, and the second electrode 12 may be electrically coupled to the bit line. Each of the electrode 11 and the electrode 12 may include tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), or the like, or a combination thereof.

Figure 3:
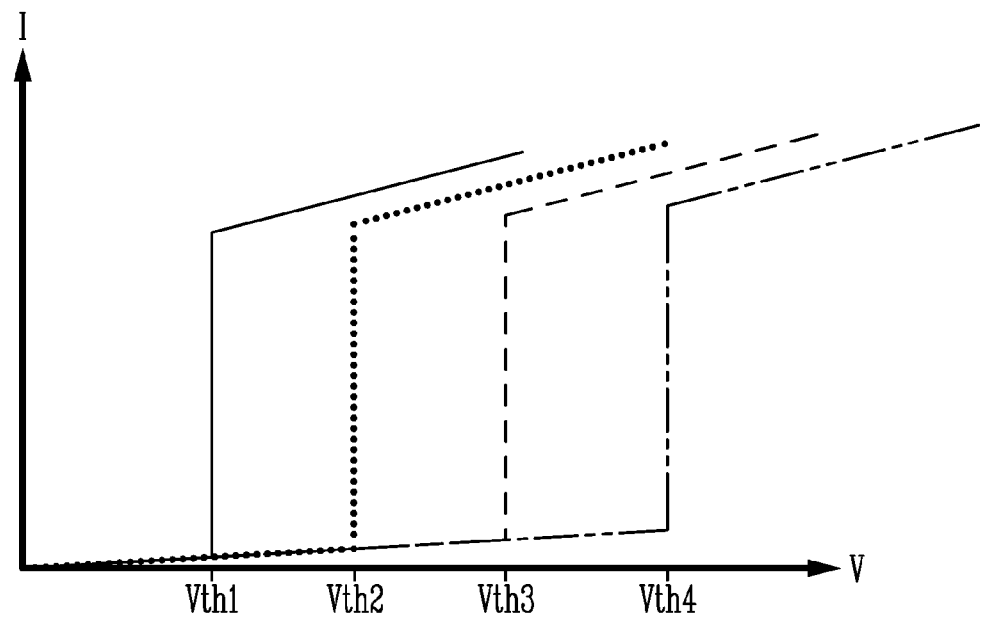
FIG. 3 describes operating characteristics of a semiconductor device in accordance with an embodiment of the present disclosure.

FIG. 3 describes operating characteristics of a semiconductor device in accordance with an embodiment of the present disclosure. An x-axis may be a voltage, and a y-axis may be a current. FIG. 3 may describe operating characteristics of the semiconductor device illustrated in FIG. 2.

Referring to FIG. 3, the threshold voltage of the memory cell MC may be changed according to the resistance of the variable resistance layer 13. Therefore, by applying a program pulse to the memory cell MC to change the threshold voltage, data may be stored in the memory cell MC.

The memory cell MC may be programmed to store at least two-bit data. In an embodiment, the programmed memory cell MC may have one of a logic state '00,' a logic state '01,' a logic state '10,' and a logic state '11.' A first threshold voltage Vth1 may correspond to the logic state '00,' a second threshold voltage Vth2 may correspond to the logic state '01,' a third threshold voltage Vth3 may correspond to the logic state '10,' and a fourth threshold voltage Vth4 may correspond to the logic state '11.' The second threshold voltage Vth2 may have a level higher than that of the first threshold voltage Vth1, the third threshold voltage Vth3 may have a level higher than that of the second threshold voltage Vth2, and the fourth threshold voltage Vth4 may have a level higher than that of the third threshold voltage Vth3 (Vth1<Vth2<Vth3<Vth4).

During the program operation, a waveform of the program pulse may be adjusted according to the logic state to be programmed. In an embodiment, the polarity, peak level, peak period, slew rate, or slew period of the program pulse may be adjusted.

Figure 4:
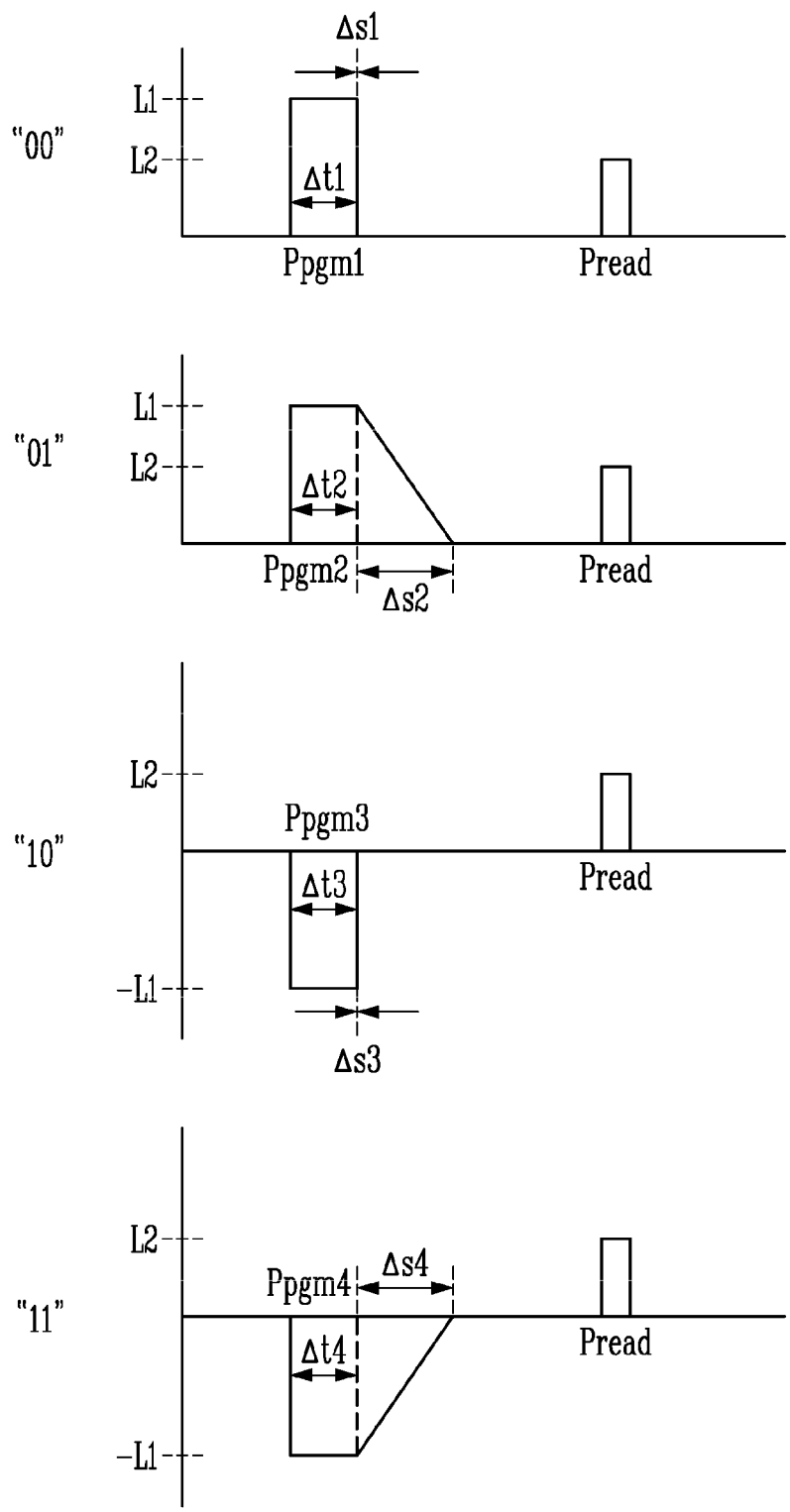
FIG. 4 describes an operation of a semiconductor device in accordance with an embodiment of the present disclosure.

FIG. 4 describes an operation of a semiconductor device in accordance with an embodiment of the present disclosure, and shows waveforms of a read pulse and a program pulse.

Referring to FIG. 4, program pulses have different waveforms according to logic states to be programmed. The semiconductor device may apply a program pulse selected from a plurality of program pulses to a selected memory cell MC according to the logic state to be programmed. Hereinafter, an embodiment where the program pulse is selected from among first to fourth program pulses Ppgm1 to Ppgm4 and the selected memory cell MC is programmed to have one of the logic state '00,', the logic state '01,' the logic state '10,' and the logic state '11' will be described with reference to FIG. 4.

The first program pulse Ppgm1 for programming the logic state '00' may have the same polarity as the read pulse Pread, and may have a first polarity. The first polarity may be positive. A peak level L1 of the first program pulse Ppgm1 may be higher than a peak level L2 of the read pulse Pread (L1>L2).

The peak level L1 of the first program pulse Ppgm1 may be a first level. The first program pulse Ppgm1 may have a first peak period Δt1 in which the peak level L1 is maintained. The first program pulse Ppgm1 may have a first slew period Δs1 in which the first program pulse Ppgm1 falls from the peak level L1 to the ground level. The sum of the first peak period Δt1 and the first slew period Δs1 may be an application time of the first program pulse Ppgm1. The first program pulse Ppgm1 may rise to the first level L1 at a first rising slew rate and then fall to the ground level at a first falling slew rate. In an embodiment, the first program pulse Ppgm1 may have a relatively short first slew period Δs1, and have a relatively high first falling slew rate. Furthermore, the first program pulse Ppgm1 may have a relatively high first rising slew rate.

The second program pulse Ppgm2 for programming the logic state '01' may have the same polarity as the first program pulse Ppgm1, and may be different in at least one of the peak level, the peak period, and the falling slew rate from the first program pulse Ppgm1. The second program pulse Ppgm2 may have the same polarity as the read pulse Pread, and may have the first polarity. The second program pulse Ppgm2 may have a peak level higher than that of the read pulse Pread. The second program pulse Ppgm2 may have substantially the same peak level as the first program pulse Ppgm1, and thus the peak level of the second program pulse Ppgm2 may be the first level L1.

The second program pulse Ppgm2 may include a second peak period Δt1 and a second slew period Δs2. The second program pulse Ppgm2 may rise to the first level L1 at a second rising slew rate and then fall to the ground level at a second falling slew rate. The second peak period Δt2 may be substantially the same as the first peak period Δt1. The second program pulse Ppgm2 may have a relatively long second slew period Δs2, and have a relatively low second falling slew rate. The second slew period Δs2 may be longer than the first slew period Δs1, and the second falling slew rate may be less than the first falling slew rate. The first rising slew rate of the first program pulse Ppgm1 and the second rising slew rate of the second program pulse Ppgm2 may be substantially the same.

The third program pulse Ppgm3 for programming the logic state '10' may have a polarity different from that of the read pulse Pread, and may have a second polarity. The second polarity may be negative. An absolute value of a peak level of the third program pulse Ppgm3 may be greater than that of the read pulse Pread. The absolute value of the peak level of the third program pulse Ppgm3 may have substantially the same as an absolute value of the peak level L1 of the first program pulse Ppgm1 or the second program pulse Ppgm2.

The third program pulse Ppgm3 may include a third peak period Δt3 and a third slew period Δs3. The third program pulse Ppgm3 may fall to a negative first level −L1 at a third falling slew rate and a level thereof may rise at a third rising slew rate. The third peak period Δt3 may be substantially the same as the first peak period Δt1 or the second peak period Δt2. The third program pulse Ppgm3 may have a relatively short third slew period Δs3, and thus have a relatively high third rising slew rate.

The fourth program pulse Ppgm4 for programming the logic state '11' may have the same polarity as the third program pulse Ppgm3, and may be different in at least one of the peak level, the peak period, and the rising slew rate from the third program pulse Ppgm3. The fourth program pulse Ppgm4 may have a polarity different from that of the read pulse Pread, and may have the second polarity. An absolute value of the peak level of the fourth program pulse Ppgm4 may be greater than that of the read pulse Pread. The absolute value of the peak level of the fourth program pulse Ppgm4 may be substantially the same as the absolute value of the peak level of the third program pulse Ppgm3.

The fourth program pulse Ppgm4 may include a fourth peak period Δt4 and a fourth slew period Δs4. The fourth program pulse Ppgm4 may fall to the negative first level −L1 at a fourth falling slew rate and a level thereof may rise at a fourth rising slew rate. The fourth peak period Δt4 may be substantially the same as the third peak period Δt3. The fourth program pulse Ppgm4 may have a relatively long fourth slew period Δs4, and thus have a relatively low fourth rising slew rate. The fourth slew period Δs4 may be longer than the third slew period Δs3, and the fourth rising slew rate may be less than the third rising slew rate. The fourth falling slew rate may be substantially the same as the third falling slew rate. The fourth slew period Δs4 may be substantially the same as the second slew period Δs2.

In an embodiment, when the logic state to be programmed is '00,' the first program pulse Ppgm1 may be selected from among the plurality of program pulses Ppgm1 to Ppgm4. By applying the first program pulse Ppgm1 to the memory cell MC, the threshold voltage of the memory cell MC may be changed to the first threshold voltage Vth1 of FIG. 3. When the logic state to be programmed is '01,' the second program pulse Ppgm2 may be selected from among the plurality of program pulses Ppgm1 to Ppgm4. By applying the second program pulse Ppgm2 to the memory cell MC, the threshold voltage of the memory cell MC may be changed to the second threshold voltage Vth2 of FIG. 3. When the logic state to be programmed is '10,' the third program pulse Ppgm3 may be selected from among the plurality of program pulses Ppgm1 to Ppgm4. By applying the third program pulse Ppgm3 to the memory cell MC, the threshold voltage of the memory cell MC may be changed to the third threshold voltage Vth3 of FIG. 3. When the logic state to be programmed is '11,' the fourth program pulse Ppgm4 may be selected from among the plurality of program pulses Ppgm1 to Ppgm4. By applying the fourth program pulse Ppgm4 to the memory cell MC, the threshold voltage of the memory cell MC may be changed to the fourth threshold voltage Vth4 of FIG. 3.

According to the above-described operating method, the threshold voltage of the memory cell MC may be changed according to the waveform of the program pulse. The first program pulse Ppgm1 may have the first polarity, and may be applied for a relatively short time. The second program pulse Ppgm2 may have the first polarity, and may be applied for a longer time than the first program pulse Ppgm1. The third program pulse Ppgm3 may have the second polarity, and may be applied for a relatively short time. The fourth program pulse Ppgm4 may have the second polarity, and may be applied for a longer time than the third program pulse Ppgm3. Thus, by adjusting the polarity, the peak level, the peak period, the slew period, and the slew rate of the program pulse, the memory cell MC can be programmed to have one of multiple logic states.

Although it is illustrated n FIG. 4 that the read pulse Pread, the first program pulse Ppgm1, and the second program pulse Ppgm2 each have the positive polarity, and the third program pulse Ppgm3 and the fourth program pulse Ppgm4 each have the negative polarity, embodiments are not limited thereto. In accordance with another embodiment, the read pulse Pread may have the negative polarity, and the polarities of the first to fourth program pulses Ppgm1 to Ppgm4 may be changed accordingly.

FIGS. 5A to 5E describe an operation of a semiconductor device in accordance with an embodiment of the present disclosure. FIGS. 5A to 5E may describe an operation of the semiconductor device illustrated in FIG. 2.

Figure 5A:
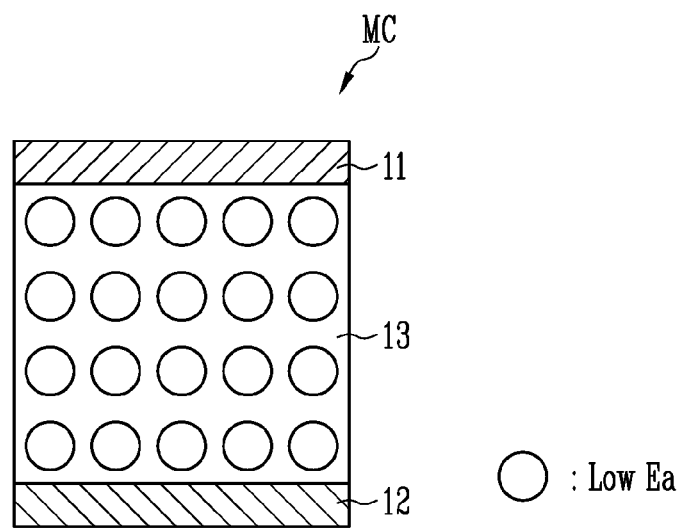
FIGS. 5A to 5E describe an operation of a semiconductor device in accordance with an embodiment of the present disclosure.

FIG. 5A shows a state in which the memory cell MC is turned on by an initial activation operation. Since trap sites in the variable resistance layer 13 immediately after it is deposited may have high activation energy High Ea, the initial activation operation for turning on the memory cell MC is required in order to activate the variable resistance layer 13. When the memory cell MC is turned on, the trap sites are activated and have low activation energy Low Ea. Thus, the variable resistance layer 13 has metal properties.

Figure 5B:
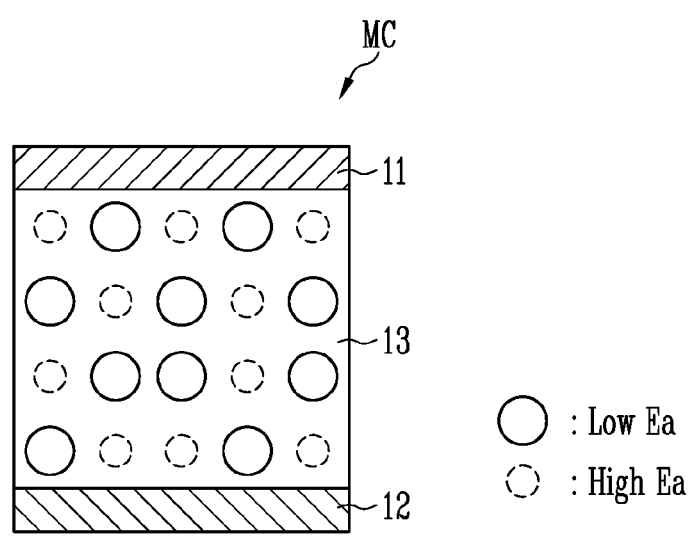
Figure 5C:
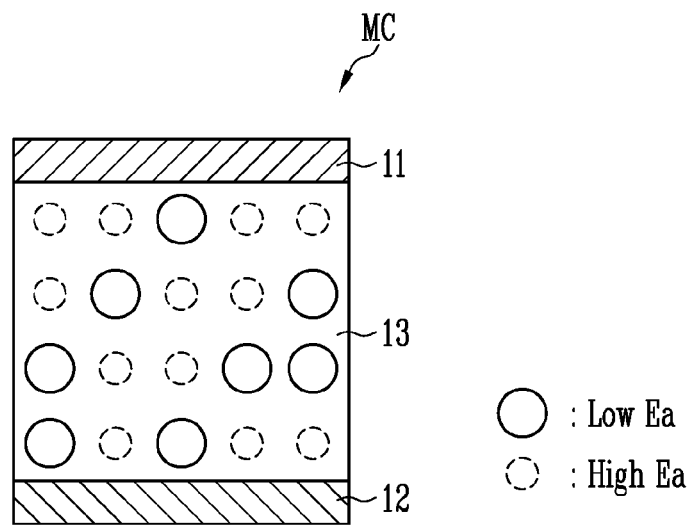
Figure 5D:
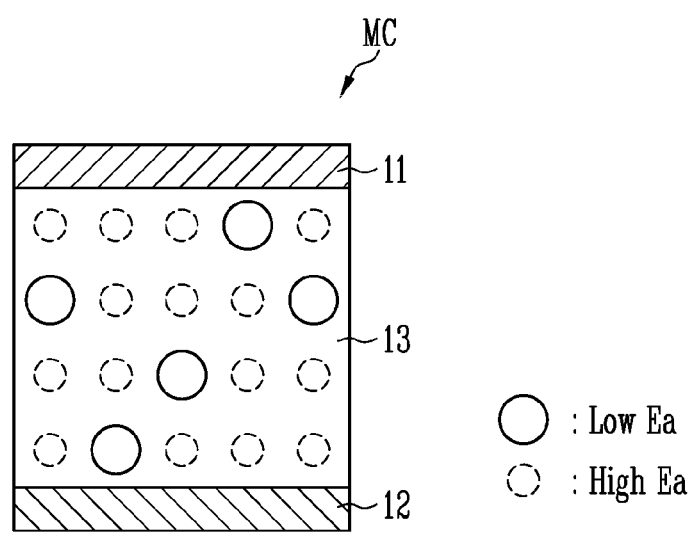

FIGS. 5B to 5D relate to a program operation using the first to fourth program pulses Ppgm1 to Ppgm4 described above with reference to FIG. 4. When the program operation is performed on the memory cell MC on which the initial activation operation has been performed, the threshold voltage of the memory cell MC may be adjusted according to the waveform of the program pulse.

FIG. 5B shows a case in which the first program pulse Ppgm1 is applied to the memory cell MC and the programmed memory cell MC has the logic state '00.' Since the first program pulse Ppgm1 has the same first polarity as the read pulse Pread, the memory cell MC has a relatively low threshold voltage. Furthermore, since the first program pulse Ppgm1 has a relatively short application time, a sufficient time is not secured for the activated trap sites to be stabilized. Thus, many of the activated trap sites still have the low activation energy Low Ea. Thus, the memory cell MC in the logic state '00' may have the first threshold voltage Vth1.

FIG. 5C shows a case in which the second program pulse Ppgm2 is applied to the memory cell MC and the programmed memory cell MC has the logic state '01.' Since the second program pulse Ppgm2 has the same first polarity as the read pulse Pread, the memory cell MC has a relatively low threshold voltage. Meanwhile, since the second program pulse Ppgm2 has a relatively long application time, a sufficient time or energy may be secured for the activated trap sites to be stabilized. Therefore, many of the trap sites have the high activation energy High Ea. Thus, the memory cell MC in the logic state '01' may have the second threshold voltage Vth2 that is higher than the first threshold voltage Vth1 in the logic state '00.'

FIG. 5D shows a case in which the third program pulse Ppgm3 is applied to the memory cell MC and the programmed memory cell MC has the logic state '10.' Since the third program pulse Ppgm3 has the second polarity different from that of the read pulse Pread, the memory cell MC has a relatively high threshold voltage. The number of the trap sites having the low activation energy Low Ea is reduced, and thus the overall activation energy of the variable resistance layer 13 is increased. Since the third program pulse Ppgm3 has a relatively short application time, a sufficient time is not secured for the activated trap sites to be stabilized. Therefore, the memory cell MC in the logic state '10' may have the third threshold voltage Vth3 that is higher than the second threshold voltage Vth2 in the logic state '01' but is lower than the fourth threshold voltage Vth4 in the logic state '11.'

Figure 5E:
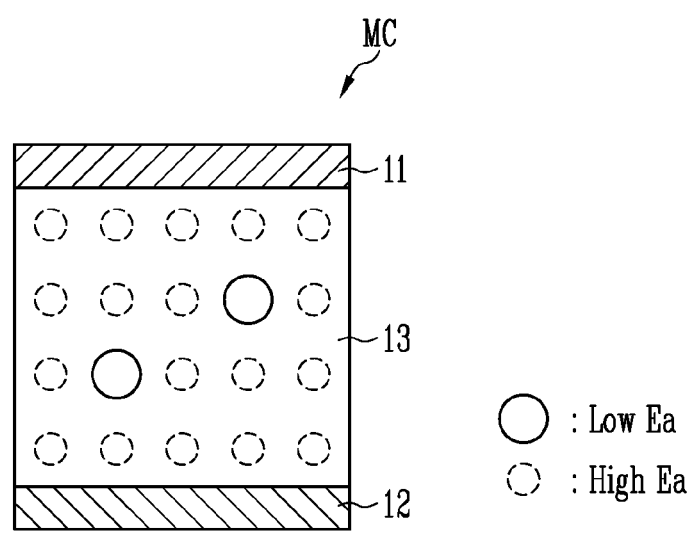

FIG. 5E shows a case in which the fourth program pulse Ppgm4 is applied to the memory cell MC and the programmed memory cell MC has the logic state '11.' Since the fourth program pulse Ppgm4 has the second polarity different from that of the read pulse Pread, the memory cell MC has a relatively high threshold voltage. Furthermore, since the fourth program pulse Ppgm4 has a relatively long application time, a sufficient time may be secured for the activated trap sites to be stabilized. Thus, the memory cell MC in the logic state '11' may have the fourth threshold voltage Vth4 that is higher than the third threshold voltage Vth3 in the logic state '10.'

According to the above-described operating method, by supplying sufficient energy through the program pulse for a sufficient time to increase the activation energy of the trap sites in the variable resistance layer 13, the trap sites may be stabilized and the threshold voltage of the memory cell MC may be increased. Therefore, the memory cell MC may be programmed in one of the multiple logic states by adjusting the waveform of the program pulse.

Figure 6:
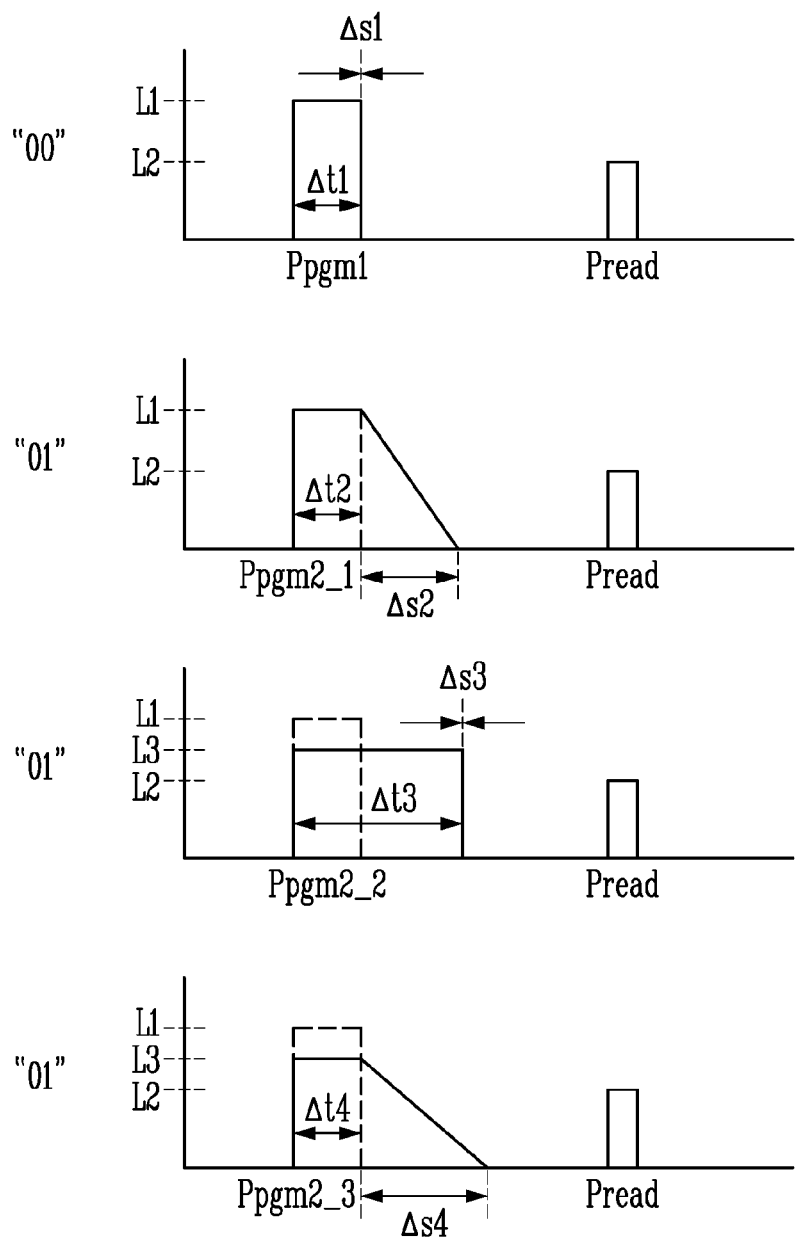
FIG. 6 describes an operation of a semiconductor device in accordance with an embodiment of the present disclosure.

FIG. 6 describes an operation of a semiconductor device in accordance with an embodiment of the present disclosure, and shows waveforms of a read pulse and program pulses.

Referring to FIG. 6, the program pulses have different waveforms according to logic states to be programmed. The semiconductor device may apply a program pulse selected from among a plurality of program pulses to a selected memory cell according to a logic state to be programmed. Hereinafter, the modification of the second program pulse Ppgm2 described with reference to FIG. 4 will be described.

The first program pulse Ppgm1 for programming a logic state '00' may have the same polarity as the read pulse Pread, and may have a first polarity. The first polarity may be positive. The first program pulse Ppgm1 may have a peak level L1 higher than a peak level L2 of the read pulse Pread (L1>L2). The peak level L1 is a first level.

The first program pulse Ppgm1 may have a first peak period Δt1 in which the first level L1 is maintained and a first slew period Δs1 in which the level of the first program pulse Ppgm1 falls to the ground level. The first program pulse Ppgm1 may rise to the first level L1 at a first rising slew rate and then fall to the ground level at a first falling slew rate. In an embodiment, the first program pulse Ppgm1 may have a relatively short first slew period Δs1, and have a relatively high first falling slew rate. Furthermore, the first program pulse Ppgm1 may have a relatively high first rising slew rate.

The second program pulses Ppgm2_1 to Ppgm2_3 for programming a logic state '01' each may have the same polarity as the read pulse Pread, and may have the first polarity. The second program pulses Ppgm2_1 to Ppgm2_3 each may have a peak level higher than that of the read pulse Pread. The peak level, peak period, slew rate, and slew period of each of the second program pulses Ppgm2_1 to Ppgm2_3 may be adjusted in various ways.

In an embodiment, the 2_1-th program pulse Ppgm2_1 may have substantially the same level as the first program pulse Ppgm1, i.e., may have the first level L1. The 2_1-th program pulse Ppgm2_1 may have a second peak period Δt1 and a second slew period Δs2. The 2_1-th program pulse Ppgm2_1 may rise to the first level L1 at a second rising slew rate and then fall to the ground level at a second falling slew rate. The second peak period Δt2 may be substantially the same as the first peak period Δt1. The 2_1-th program pulse Ppgm2_1 may have a relatively long second slew period Δs2, and have a relatively low second falling slew rate. The second slew period Δs2 may be longer than the first slew period Δs1, and the second falling slew rate may be less than the first falling slew rate. The first rising slew rate of the first program pulse Ppgm1 and the second rising slew rate of the 2_1-th program pulse Ppgm2_1 may be substantially the same.

In an embodiment, the 2_2-th program pulse Ppgm2_2 may have a level lower than the first level L1, and may have a third level L3 (L3<L1). The 2_2-th program pulse Ppgm2_2 may include a third peak period Δt3 and a third slew period Δs3. The 2-2-th program pulse Ppgm2_2 may rise to the third level L3 at a third rising slew rate and then fall to the ground level at a third falling slew rate. The third peak period Δt3 may be relatively long, and be longer than the first peak period Δt1 or the second peak period Δt1. The third peak period Δt3 may be substantially the same as the sum of the second peak period Δt2 and the second slew period Δs2. The 2_2-th program pulse Ppgm2_2 may have a relatively short third slew period Δs3, and have a relatively high third falling slew rate. The third slew period Δs3 may be shorter than the second slew period Δs2, and the third falling slew rate may be higher than the second falling slew rate.

In an embodiment, the 2_3-th program pulse Ppgm2_3 may have a level lower than the first level L1, and may have the third level L3. The 2_3-th program pulse Ppgm2_3 may include a fourth peak period Δt4 and a fourth slew period Δs4. The 2-3-th program pulse Ppgm2_3 may rise to the third level L3 at a fourth rising slew rate and then fall to the ground level at a fourth falling slew rate. The fourth peak period Δt4 may be substantially the same as the first peak period Δt1 or the second peak period Δt1. The fourth peak period Δt4 may be shorter than the third peak period Δt3. The 2_3-th program pulse Ppgm2_3 may have a relatively long fourth slew period Δs4, and have a relatively low fourth falling slew rate. The fourth slew period Δs4 may be longer than the third slew period Δs3, and the fourth falling slew rate may be less than the third falling slew rate. The sum of the fourth peak period Δt4 and the fourth slew period Δs4 may be longer than the sum of the third peak period Δt3 and the third slew period Δs3.

Although FIG. 6 illustrates the modification of the second program pulse Ppgm2 of FIG. 4, the third program pulse Ppgm3 or the fourth program pulse Ppgm4 of FIG. 4 may be similarly modified.

Figure 7:
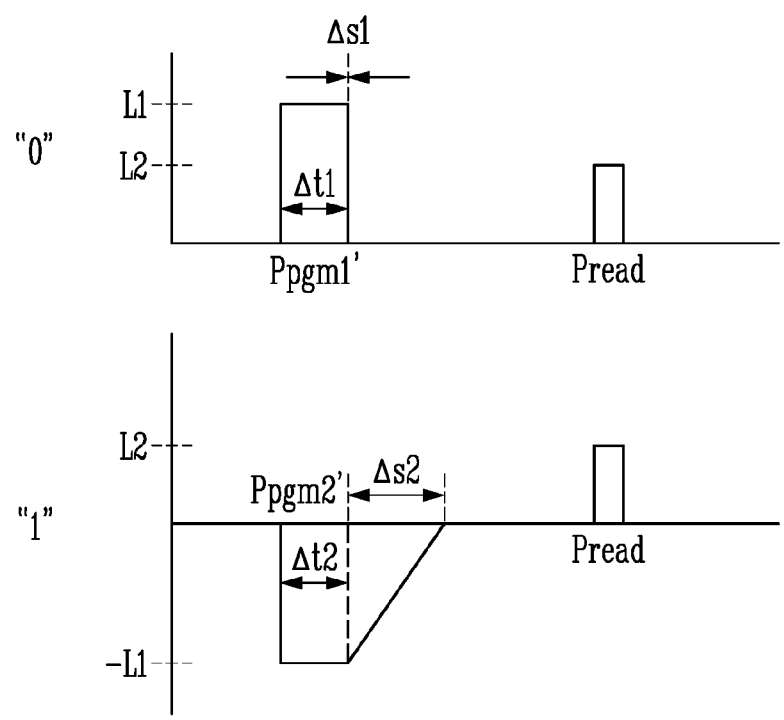
FIGS. 7 and 8 describe an operation of a semiconductor device in accordance with an embodiment of the present disclosure.
Figure 8:
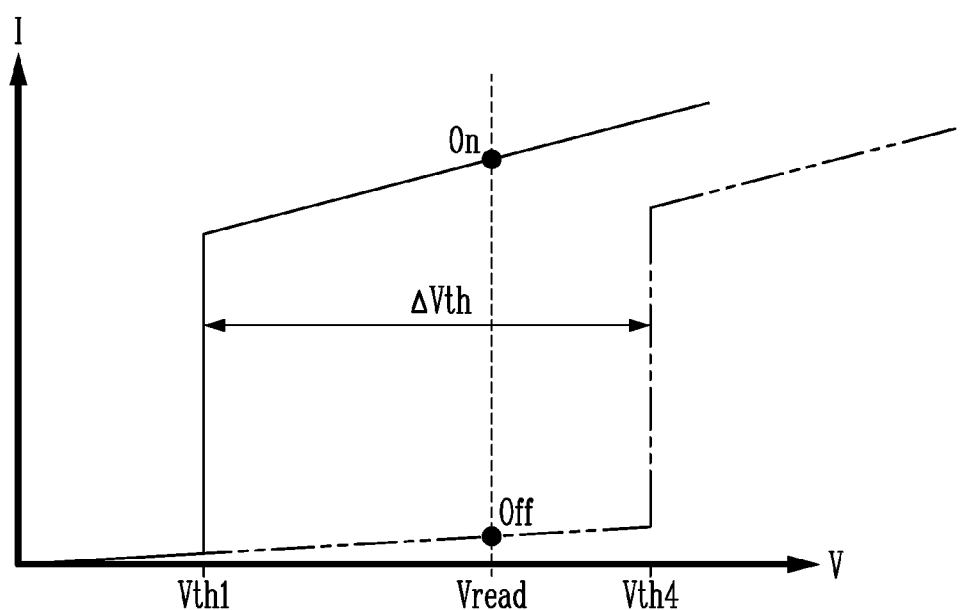

FIGS. 7 and 8 describe an operation of a semiconductor device in accordance with an embodiment of the present disclosure. FIG. 7 shows waveforms of a read pulse and program pulses, while FIG. 8 shows a threshold voltage distribution of a programmed memory cell. In FIG. 8, an x-axis represents a voltage, and a y-axis represents a current.

Referring to FIG. 7, the program pulses may have different waveforms according to logic states to be programmed. The semiconductor device may apply a program pulse selected from among a plurality of program pulses to a selected memory cell MC according to a logic state to be programmed. Hereinafter, an embodiment where the memory cell MC is programmed to have a single-bit data using two program pulses selected from among the above-described first to fourth program pulses Ppgm1 to Ppgm4 will be described.

A first program pulse Ppgm1' for programming a logic state '0' may be substantially the same as the first program pulse Ppgm1 described above. The first program pulse Ppgm1' may have the same polarity as the read pulse Pread, and may have a first polarity. The first polarity may be positive. The first program pulse Ppgm1' may have a peak level L1 higher than the peak level L2 of the read pulse Pread (L1>L2).

The first program pulse Ppgm1' may have a first peak period Δt1 in which the first level L1 is maintained and a first falling slew period Δs1 in which the level falls to the ground level. The first program pulse Ppgm1' may rise to the first level L1 at a first rising slew rate and then the level may fall to the ground level at a first falling slew rate. In an embodiment, the first program pulse Ppgm1' may have a relatively short first slew period Δs1, and have a relatively high first falling slew rate.

A second program pulse Ppgm2' for programming a logic state '1' may have a polarity different from that of the first program pulse Ppgm1', and may be different in at least one of the peak level, the peak period, and the slew rate from the first program pulse Ppgm1'. In an embodiment, the second program pulse Ppgm2' may be substantially the same as the fourth program pulse Ppgm4 described above with reference to FIG. 4. An absolute value of a peak level of the second program pulse Ppgm2' may have higher than that of the read pulse Pread. The absolute value of the peak level of the second program pulse Ppgm2' may have substantially the same as the absolute value of the peak level of the first program pulse Ppgm1'. That is, the absolute value of the peak level of the second program pulse Ppgm2' is L1.

The second program pulse Ppgm2' may include a second peak period Δt2 and a second slew period Δs2. The second program pulse Ppgm2' may fall to a negative first level −L1 at a second falling slew rate and may rise to the ground level at a second rising slew rate. The second peak period Δt2 may be substantially the same as the first peak period Δt1 of the first program pulse Ppgm1'. The second program pulse Ppgm2' may have a relatively long second slew period Δs2, and have a relatively low second rising slew rate. The second slew period Δs2 may be longer than the first slew period Δs1 of the first program pulse Ppgm1', and the second rising slew rate may be less than the first rising slew rate of the first program pulse Ppgm1'. The sum of the second peak period Δt2 and the second slew period Δs2 may be longer than the first peak period Δt1. The sum of the second peak period Δt2 and the second slew period Δs2 may be longer than the sum of the first peak period Δt1 and the first slew period Δs1.

Although FIG. 7 illustrates the embodiment where the first program pulse Ppgm1' has the positive polarity and the second program pulse Ppgm2' has the negative polarity, in another embodiment, the first program pulse Ppgm1' may have the negative polarity and the second program pulse Ppgm2' may have the positive polarity.

Referring to FIGS. 7 and 8, when the logic state to be programmed is '0,' the first program pulse Ppgm1' may be applied to the selected memory cell MC, and the programmed memory cell MC may have the threshold voltage Vth1. When the logic state to be programmed is '1,' the second program pulse Ppgm2' may be applied to the selected memory cell MC, and the programmed memory cell MC may have the threshold voltage Vth4.

As shown in FIG. 8, the read pulse Pread may have a level corresponding to a read voltage Vread that is greater than the first threshold voltage Vth1 and is less than the fourth threshold voltage Vth4. When the selected memory cell MC has the logic state of '1,' the memory cell MC may be turned off when the read voltage Vread is applied thereto. When the selected memory cell MC has the logic state of '0,' the memory cell MC may be turned on when the read voltage Vread is applied thereto.

According to the above-described operating method, the memory cell MC may be programmed to have a single-bit data using two program pulses selected from among the first to fourth program pulses Ppgm1 to Ppgm4. The memory cell MC in the logic state of '0' may have the first threshold voltage Vth1, and the memory cell MC in the logic state of '1' may have the fourth threshold voltage Vth4. Therefore, a difference ΔVth in the threshold voltage between the logic state '0' and the logic state '1' may be increased, and a memory window or memory margin may be secured.

Figure 9:
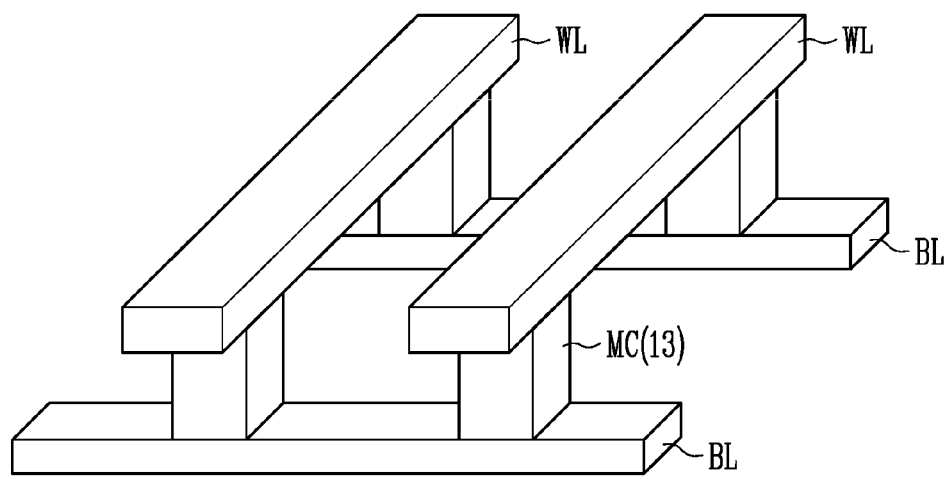
FIG. 9 illustrates a cell structure of a semiconductor device in accordance with an embodiment of the present disclosure.

FIG. 9 illustrates a cell structure of a semiconductor device in accordance with an embodiment of the present disclosure. Hereinbelow, repetitive explanation will be omitted if deemed redundant.

Referring to FIG. 9, the semiconductor device may include word lines WL, bit lines BL, and memory cells MC. The word lines WL may extend in a first direction I. The bit line BL may extend in a second direction II intersecting the first direction I. The word lines WL and the bit lines BL may be stacked in a third direction III. The third direction III may be a direction protruding from a plane defined in the first direction I and the second direction II, and may protrude vertically from the plane.

The memory cells MC may be disposed at intersection regions of the word lines WL and the bit lines BL. In an embodiment, each of the memory cells MC may include a variable resistance layer 13. The variable resistance layer 13 may include a chalcogenide-based layer that maintains an amorphous state. The memory cells MC each may further include a first electrode interposed between the word line WL and the variable resistance layer 13, or may further include a second electrode interposed between the bit line BL and the variable resistance layer 13, or both. Alternatively, a portion of the word line WL may be the first electrode, or a portion of the bit line BL may be the second electrode.

Meanwhile, although FIG. 9 shows the cell structure in which the memory cells MC are arranged in the first direction I and the second direction II, the memory cells MC may be stacked in the third direction III. Bit lines BL and word lines WL may be alternately stacked in the third direction III, and the memory cells MC may be positioned between the bit lines BL and the word lines WL that are alternately stacked.

Figure 10A:
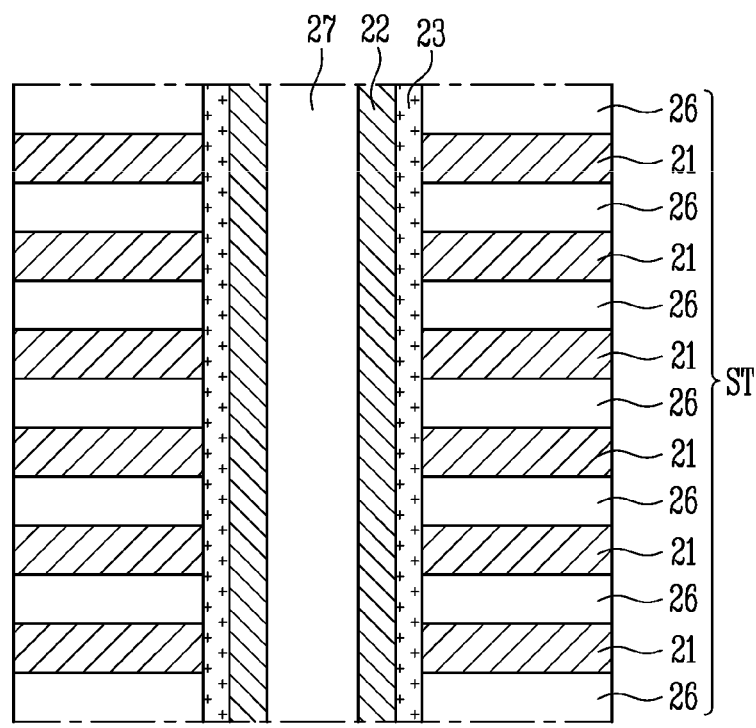
FIGS. 10A and 10B illustrate a semiconductor device in accordance with embodiments of the present disclosure.
Figure 10B:
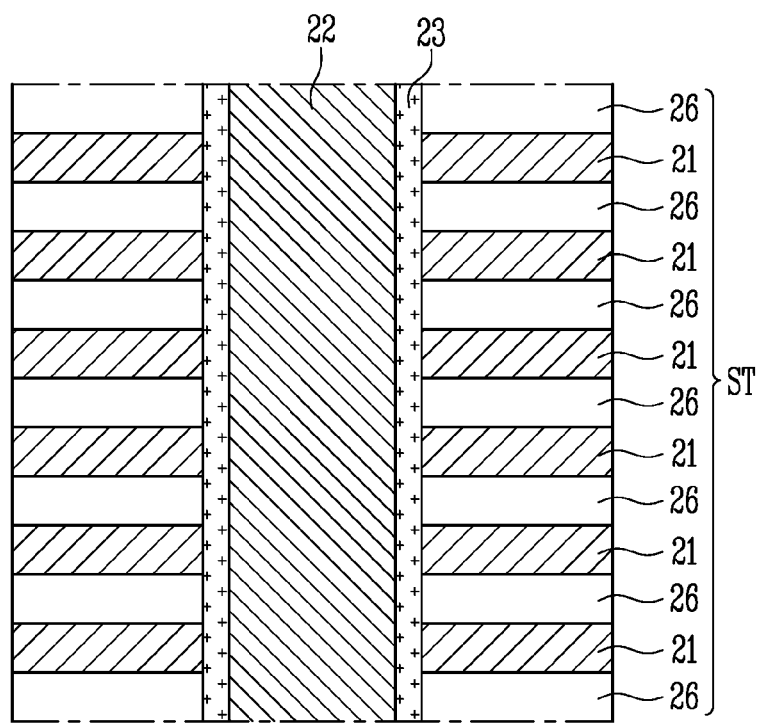

FIGS. 10A and 10B illustrate semiconductor devices in accordance with embodiments of the present disclosure. Hereinbelow, repetitive explanation will be omitted if deemed redundant.

Referring to FIGS. 10A and 10B, the semiconductor device may include a stack ST, a variable resistance layer 23, and a second conductive layer 22. The semiconductor device of FIG. 10A may further include a gap-fill layer 27.

The stack ST may include first conductive layers 21 and insulating layers 26 which are alternately stacked. The first conductive layers 21 may include tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), polysilicon, or the like, or may include a combination thereof. The first conductive layers 21 each may be a word line or a bit line. The insulating layers 26 may function to insulate the first conductive layers 21 from each other, and include an insulating material such as an oxide or a nitride.

The second conductive layer 22 may pass through the stack ST. Referring to FIG. 10A, the second conductive layer 22 may have a structure in which a central region is opened. In this case, the gap-fill layer 27 may fill the central region of the second conductive layer 22. Referring to FIG. 10B, the second conductive layer 22 may have a structure without the central region that is opened. In this case, the gap-fill layer 27 may not be formed in the second conductive layer 22.

The second conductive layer 22 may include tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), polysilicon, or the like, or may include a combination thereof. The second conductive layer 22 may be the word line or the bit line.

The variable resistance layer 23 may be located between the second conductive layer 22 and the first conductive layers 21. The variable resistance layer 23 may be formed to enclose a sidewall of the second conductive layer 22. The variable resistance layer 23 may include a chalcogenide-based layer that maintains an amorphous state.

According to the above-described structure, memory cells may be located in intersection regions of the first conductive layers 21 and the second conductive layer 22.

The memory circuit or semiconductor device of the above-described embodiments may be used in various devices or systems. FIGS. 11 to 14 illustrate some examples of devices or systems that may employ the memory circuit or the semiconductor device of the above-described embodiments.

Figure 11:
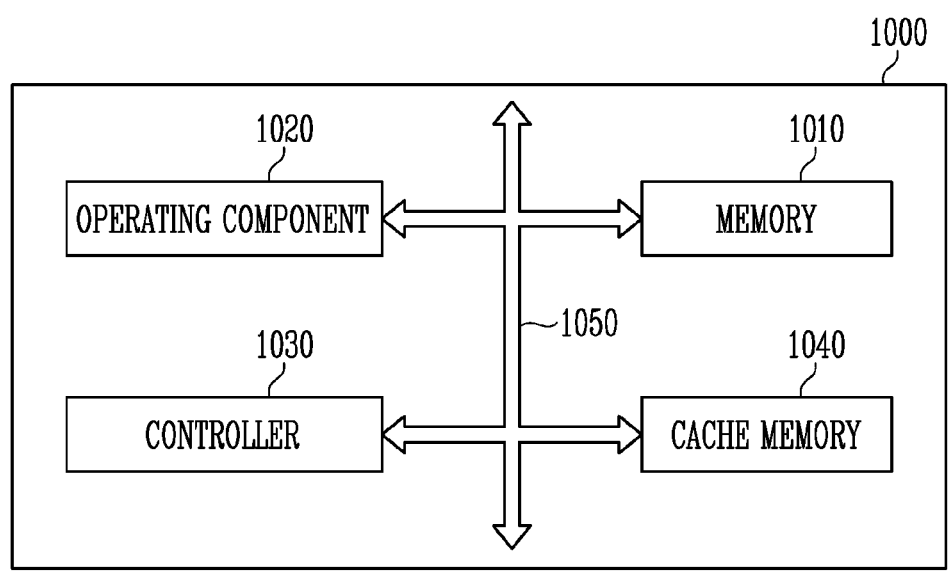
FIG. 11 illustrates a configuration of a microprocessor employing a semiconductor device in accordance with an embodiment of the present disclosure.

FIG. 11 illustrates a configuration of a microprocessor 1000 employing a semiconductor device in accordance with an embodiment of the present disclosure.

Referring to FIG. 11, the microprocessor 1000 may control a series of processes that receive data from various external devices, process the data, and send the processed result to the external devices. The microprocessor 1000 may include a memory 1010, an operating component 1020, a controller 1030, etc. The microprocessor 1000 may be any of various data processors, such as a Central Processing Unit (CPU), a Graphic Processing Unit (GPU), a Digital Signal Processor (DSP), an Application Processor (AP), or the like.

The memory 1010 may be a component, such as a processor register or a register, which stores data in the microprocessor 1000, and include any of various registers, such as a data register, an address register, a floating point register, or the like. The memory 1010 may serve to temporarily store addresses in which data for executing an operation by the operating component 1020, data for execution results, and data for execution are stored.

The memory 1010 may include one or more of the semiconductor devices in accordance with the above-described embodiments. For instance, the memory 1010 may include one or more memory devices. Each memory device may include a cell array including memory cells each for storing multi-bit data; a voltage generator for generating a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse; and a control logic circuit receiving a logic state that is to be programmed into a memory cell selected from the memory cells, and applying a program pulse selected from a group including the first to fourth program pulses to the selected memory cell, thus performing a program operation. Thereby, the reliability of the memory 1010 can be improved and a manufacturing process of the memory 1010 can be improved. Consequently, operating characteristics of the microprocessor 1000 can be improved.

The operating component 1020 may perform various fundamental arithmetic operations or logic operations according to a result of a command decoded by the controller 1030. The operating component 1020 may include one or more arithmetic and logic units (ALUs).

The controller 1030 may receive signals from the memory 1010, the operating component 1020, and the external device of the microprocessor 1000, extract or decode commands, control inputting and outputting of a signal of the microprocessor 1000, and execute a process represented by a program.

The microprocessor 1000 according to the present embodiment may further include a cache memory 1040 that may temporarily store write data input from the external device or temporarily store read data to be output to the external device, in addition to the memory 1010. In this case, the cache memory 1040 may exchange data with the memory 1010, the operating component 1020, and the controller 1030 through a bus interface 1050.

Figure 12:
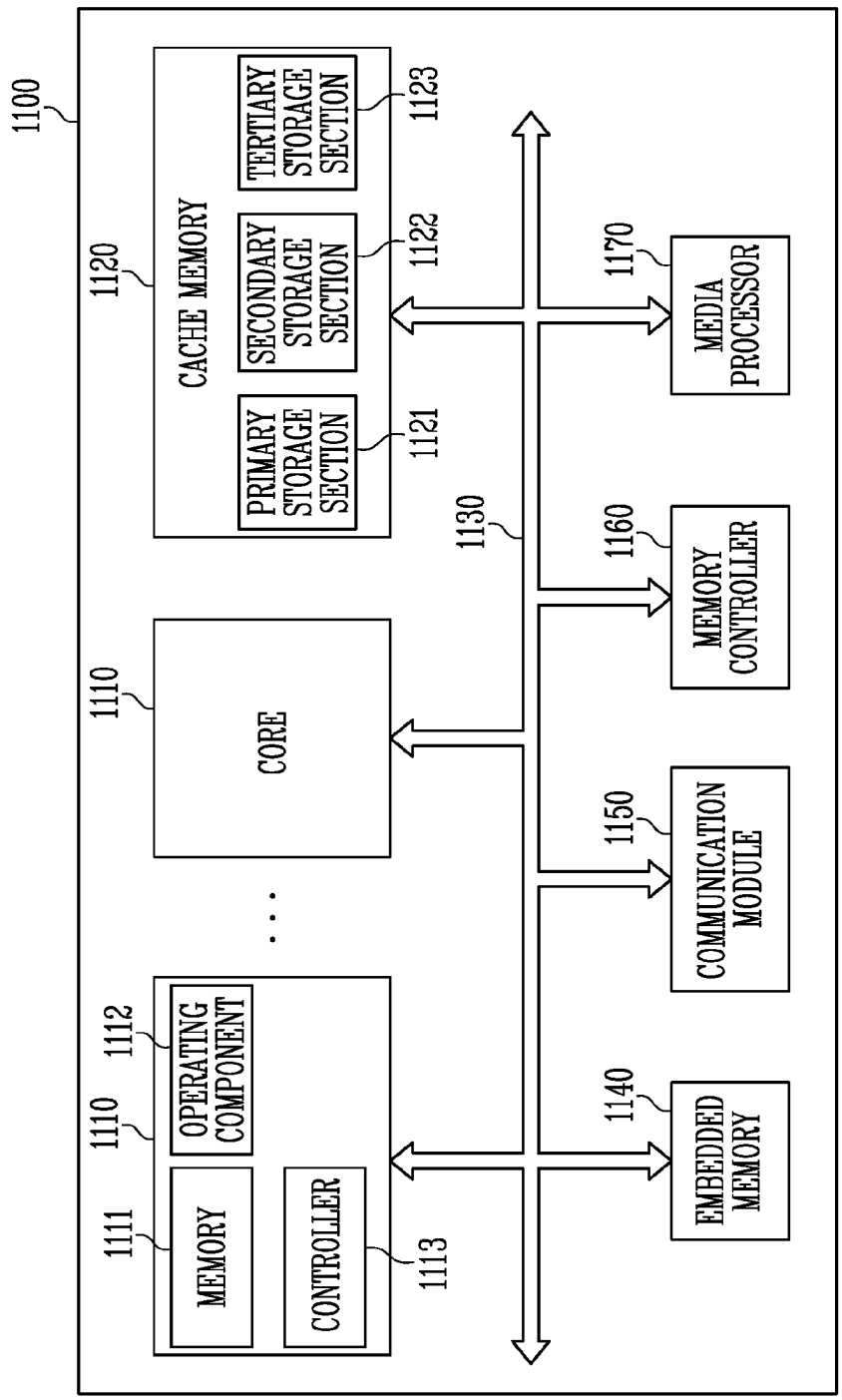
FIG. 12 illustrates a configuration of a processor employing a semiconductor device in accordance with an embodiment of the present disclosure.

FIG. 12 illustrates a configuration of a processor 1100 employing a semiconductor device in accordance with an embodiment of the present disclosure.

Referring to FIG. 12, the processor 1100 may improve performance and realize multi-functionality by including various functions as well as the function of the microprocessor 1000 described above with reference to FIG. 11. The processor 1100 may include a core 1110 serving as the microprocessor, a cache memory 1120 serving to temporarily store data, and a bus interface 1130 transferring data between internal and external devices of the processor 1100. The processor 1100 may include various system on chips (SoC), such as a multi-core processor, a graphic processing unit (GPU), or an application processor (AP).

The core 1110 of this embodiment is a component that performs an arithmetic and logic operation on data input from an external device, and may include a memory 1111, an operating component 1112, and a controller 1113. The memory 1111, the operating component 1112, and the controller 1113 may be substantially the same as the memory 1010, the operating component 1020, and the controller 1030 which are described above with reference to FIG. 11.

The cache memory 1120 is a component that temporarily stores data to compensate for a difference in data processing speed between the core 1110 operating at a high speed and an external device operating at a low speed. The cache memory 1120 includes a primary storage section 1121 and a secondary storage section 1122. The cache memory 1120 may further include a tertiary storage section 1123 when a high capacity is required, and include more storage sections if necessary. In other words, the number of storage sections included in the cache memory 1120 may vary according to design. Here, the processing speeds of the primary, secondary, and tertiary storage sections 1121, 1122, and 1123 for storing and determining data may be the same or different. If the processing speeds of respective storage sections are different from each other, the processing speed of the primary storage section may be the fastest. Among the primary, secondary, and tertiary storage sections 1121, 1122, and 1123 of the cache memory 1120, one or more storage sections may include one or more of the semiconductor devices in accordance with the above-described embodiments. For example, the cache memory 1120 may include one or more memory devices. Each memory device may include a cell array including memory cells each for storing multi-bit data; a voltage generator for generating a first program pulse having a positive polarity, a second program pulse having the positive polarity and having at least one of a peak level, a peak period and a falling slew rate different from those of the first program pulse, a third program pulse having a negative polarity, and a fourth program pulse having the negative polarity and having at least one of a peak level, a peak period and a rising slew rate different from those of the third program pulse; and a control logic circuit receiving a logic state that is to be programmed into a memory cell selected from the memory cells, and applying a program pulse selected from a group including the first to fourth program pulses to the selected memory cell, thus performing a program operation. Thereby, the reliability of the cache memory 1120 can be improved and a manufacturing process of the cache memory 1120 can be improved. Consequently, operating characteristics of the processor 1100 can be improved.

In this embodiment, it is shown that all of the primary, secondary, and tertiary storage sections 1121, 1122, and 1123 are formed in the cache memory 1120. However, some or all of the primary, secondary, and tertiary storage sections 1121, 1122, and 1123 of the cache memory 1120 are formed inside the core 1110 to compensate for a difference in processing speed between the core 1110 and the external device.

The bus interface 1130 is a component that couples the core 1110, the cache memory 1120, and the other components of the processor 1100 to efficiently transmit data therebetween.

The processor 1100 according to the present embodiment may include a plurality of cores 1110, and the plurality of cores 1110 may share the cache memory 1120. The plurality of cores 1110 and the cache memory 1120 may be directly coupled to each other or may be coupled to each other through the bus interface 1130. All of the plurality of cores 1110 may be configured in the same manner as the above-described core. A storage section in each of the cores 1110 may be configured to be shared through a storage section outside the core 1110 and the bus interface 1130.

The processor 1100 according to this embodiment may further include an embedded memory 1140 for storing data, a communication module 1150 for transmitting and receiving data to and from the external device by wire or wirelessly, a memory controller 1160 for driving an external memory device, and a media processor 1170 that processes data processed by the processor 1100 or data input from an external input device and outputs data to an external interface device. The processor 1100 may include other modules and devices. In this case, the added modules and devices may exchange data with the core 1110 and the cache memory 1120 through the bus interface 1130.

Here, the embedded memory 1140 may include a volatile memory as well as a non-volatile memory. The volatile memory may include a Dynamic Random Access Memory (DRAM), a Mobile DRAM, a Static Random Access Memory (SRAM), or a memory having a similar function. The non-volatile memory may include a Read Only Memory (ROM), a NOR Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), or a memory having a similar function.

The communication module 1150 may include a wired network module that may be coupled to a wired network, a wireless network module that may be coupled to a wireless network, or both of them. The wired network module may include a wired LAN (Local Area Network), a Universal Serial Bus (USB), an Ethernet, a Power Line Communication (PLC), or any of various devices that transmits and receives data through a transmission line. The wireless network module may include Infrared Data Association (IrDA), Code Division Multiple Access (CDMA), Time Division Multiple Access (TDMA), Frequency Division Multiple Access (FDMA), Wireless LAN, Zigbee, Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or any of various devices that transmits and receives data without a transmission line.

The memory controller 1160 functions to process and manage data transmitted between the processor 1100 and an external storage device operating according to a communication standard different from that of the processor 1100. The memory controller 1160 may include any of various memory controllers such as controllers for controlling Integrated Device Electronics (IDE), Serial Advanced Technology Attachment (SATA), Small Computer System Interface (SCSI), Redundant Array of Independent Disks (RAID), Solid State Disk (SSD), External SATA (eSATA), Personal Computer Memory Card International Association (PCM-CIA), Universal Serial Bus (USB), Secure Digital (SD), mini Secure Digital card (mSD), micro SD, Secure Digital High Capacity (SDHC), Memory Stick Card, Smart Media Card (SM), Multi Media Card (MMC), Embedded MMC (eMMC), Compact Flash (CF), etc.

The media processor 1170 may process data processed by the processor 1100 or data input from the external input device in video, audio, and other forms, and output data to the external interface device. The media processor 1170 may include a Graphics Processing Unit (GPU), a Digital Signal Processor (DSP), a High Definition Audio (HD Audio), a High Definition Multimedia Interface (HDMI) controller, or the like.

Figure 13:
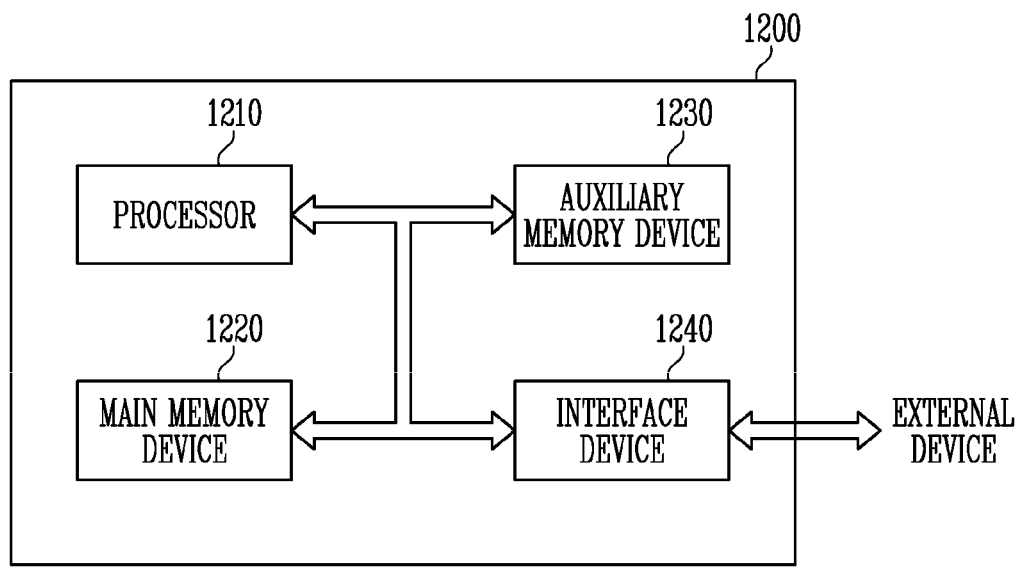
FIG. 13 illustrates a configuration of a system employing a semiconductor device in accordance with an embodiment of the present disclosure.

FIG. 13 illustrates a configuration of a system 1200 employing a semiconductor device in accordance with an embodiment of the present disclosure.

Referring to FIG. 13, the system 1200 is a device that processes data, and may perform input, processing, output, communication, storage, and the like to perform a series of operations on data. The system 1200 may include a processor 1210, a main memory device 1220, an auxiliary memory device 1230, an interface device 1240, etc. The system 1200 may be any of various electronic systems operating using a processor, such as a computer, a server, a PDA (Personal Digital Assistant), a portable computer, a web tablet, a wireless phone, a mobile phone, a smart phone, a digital music player, a PMP (portable multimedia player), a camera, a GPS (Global Positioning System), a video camera, a voice recorder, telematics, an AV (Audio Visual) system, a smart television, or the like.

The processor 1210 may control interpretation of input instructions and operations relating to data stored in the system 1200, and may be substantially the same as the microprocessor 1000 or the processor 1100 which is described above with references to FIG. 11 or 12.

The main memory device 1220 is capable of storing and executing program codes or data by moving them from the auxiliary memory device 1230 thereto when a program is executed. The main memory device 1220 may conserve memorized contents therein even if power is shut off. The auxiliary memory device 1230 refers to a memory device for storing program codes or data. The auxiliary memory device 1230 has a lower operating speed than the main memory device 1220, but may store a lot of data. The main memory device 1220 or the auxiliary memory device 1230 may include one or more of the semiconductor devices in accordance with the above-described embodiments. For example, the main memory device 1220 or the auxiliary memory device 1230 may include one or more memory devices. Each memory device may include a cell array including memory cells each for storing multi-bit data; a voltage generator for generating a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse; and a control logic circuit receiving a logic state that is to be programmed into a memory cell selected from the memory cells, and applying a program pulse selected from a group including the first to fourth program pulses to the selected memory cell, thus performing a program operation. Thereby, the reliability of the main memory device 1220 or the auxiliary memory device 1230 can be improved and a manufacturing process thereof can be improved. Consequently, operating characteristics of the system 1200 can be improved.

Figure 14:
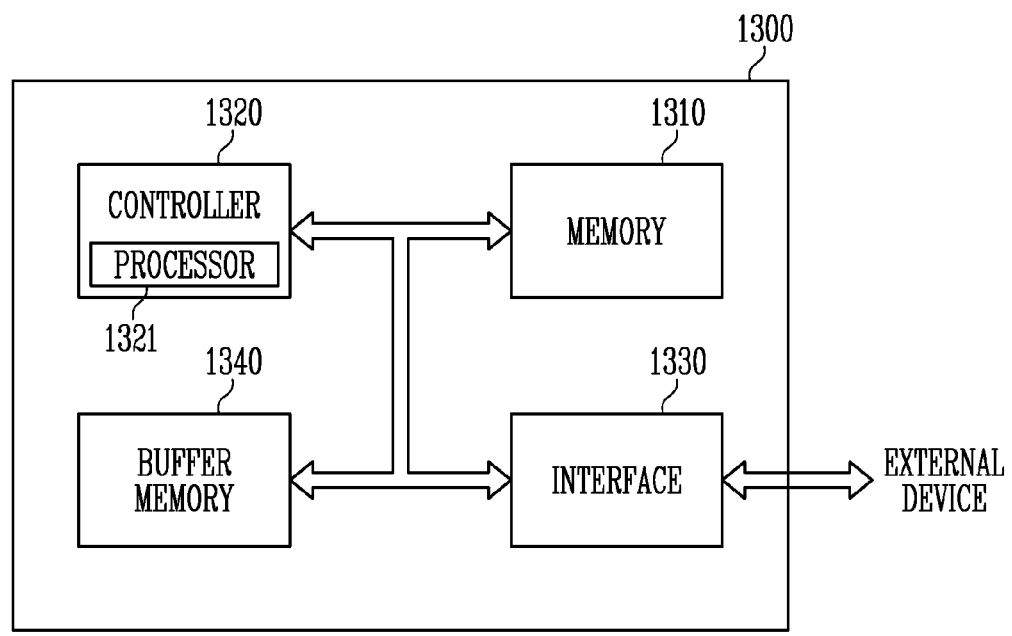
FIG. 14 illustrates a configuration of a memory system employing a semiconductor device in accordance with an embodiment of the present disclosure.

The main memory device 1220 or the auxiliary memory device 1230 may include a memory system 1300 of FIG. 14, in addition to the semiconductor device of the above-described embodiment or without including the semiconductor device of the above-described embodiment.

The interface device 1240 may serve to exchange commands, data, etc. between the system 1200 and an external device. The interface device 1240 may be any of a keypad, a keyboard, a mouse, a speaker, a mike, a display, various human Interface devices (HID), a communication device, etc. The communication device may be substantially the same as the above-described communication module 1150 of FIG. 12.

FIG. 14 illustrates a configuration of the memory system 1300 employing a semiconductor device in accordance with an embodiment of the present disclosure.

Referring to FIG. 14, the memory system 1300 may include a memory 1310 having non-volatile memory characteristics, a controller 1320 controlling the memory 1310, an interface 1330 coupling the memory system 1300 to an external device, and a buffer memory 1340 that temporarily stores data to efficiently transfer input/output of the data between the interface 1330 and the memory 1310.

The memory system 1300 may store data, and conserve stored data in the long term. The memory system 1300 may be a disk type device such as a Solid State Disk (SSD) or a card type device such as a Universal Serial Bus Memory (USB Memory), a Secure Digital (SD) card, a mini Secure Digital card (mSD), a micro SD card, a Secure Digital High Capacity (SDHC) card, a Memory Stick Card, a Smart Media Card (SM), a Multi Media Card (MMC), an Embedded MMC (eMMC), a Compact Flash (CF) card, or the like.

The memory 1310 or the buffer memory 1340 may include one or more of the semiconductor devices in accordance with the above-described embodiments. For example, the memory 1310 or the buffer memory 1340 may include one or more memory devices. Each memory device may include a cell array including memory cells each for storing multi-bit data; a voltage generator for generating a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse; and a control logic circuit receiving a logic state that is to be programmed into a memory cell selected from the memory cells, and applying a program pulse selected from a group including the first to fourth program pulses to the selected memory cell, thus performing a program operation. Thereby, the reliability of the memory 1310 or the buffer memory 1340 can be improved and a manufacturing process thereof can be improved. Consequently, operating characteristics of the memory system 1300 can be improved.

The memory 1310 or the buffer memory 1340 may include various volatile or non-volatile memories, in addition to the semiconductor device of the above-described embodiment or without including the semiconductor device of the above-described embodiment.

The controller 1320 may control data exchange between the memory 1310 and the interface 1330. To this end, the controller 1320 may include a processor 1321 that performs an operation or the like for processing commands input from an external device through the interface 1330.

The interface 1330 serves to exchange commands and data between the memory system 1300 and the external device. When the memory system 1300 is either of the card type device or the disk type device, the interface 1330 may be compatible with an interface used in the card type device or the disk type device, or may be compatible with an interface used in a similar device. The interface 1330 may be compatible with one or more interfaces having different types.

The degree of integration, operating characteristics, and reliability of a semiconductor device can be improved.

Although various embodiments have been described for illustrative purposes, it will be apparent to those skilled in the art that various changes and modifications may be made without departing from the spirit and scope of the disclosure as defined in the following claims.

What is claimed is:

1. A method of operating a semiconductor device including memory cells each storing multi-bit data, the method comprising:
   receiving data that is to be programmed in a memory cell selected from the memory cells; and
   applying a program pulse to the selected memory cell, the program pulse being determined depending on a logic state of the data and being selected from a group including a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse.

2. The method according to claim 1, wherein the second program pulse has a falling slew rate less than that of the first program pulse.

3. The method according to claim 2, wherein the first program pulse and the second program pulse have substantially the same peak level.

4. The method according to claim 1, wherein the peak period of the first program pulse is substantially the same as that of the second program pulse.

5. The method according to claim 1, wherein the second program pulse has a peak level lower than that of the first program pulse and has a peak period longer than that of the first program pulse.

6. The method according to claim 1, wherein the second program pulse has a peak level lower than that of the first program pulse and has a falling slew rate less than that of the first program pulse.

7. The method according to claim 1, wherein the third program pulse and the fourth program pulse have substantially the same peak level.

8. The method according to claim 7, wherein the third program pulse and the fourth program pulse have substantially the same level.

9. The method according to claim 7, wherein a peak period of the third program pulse is substantially the same as that of the fourth program pulse.

10. The method according to claim 1, further comprising:
    applying a read program pulse having the positive polarity to the memory cell selected from the memory cells.

11. The method according to claim 1, wherein each of the memory cells comprises a chalcogenide layer that maintains an amorphous state.

12. A semiconductor device, comprising:
    a cell array including memory cells that each store multi-bit data;
    a voltage generator configured to generate a first program pulse having a positive polarity, a second program pulse having the positive polarity and having at least one of a peak level, a peak period, and a falling slew rate different from those of the first program pulse, a third program pulse having a negative polarity, and a fourth program pulse having the negative polarity and having at least one of a peak level, a peak period, and a rising slew rate different from those of the third program pulse; and
    a control logic circuit configured to receive data that is to be programmed into a memory cell selected from the memory cells, and to apply a program pulse to the selected memory cell to perform a program operation, the program pulse being determined depending on a logic state of the data and being selected from among the first to fourth program pulses.

13. A method of operating a semiconductor device including memory cells, the method comprising:
    receiving data to be programmed in a memory cell selected from the memory cells; and
    applying a program pulse to the selected memory cell, the program pulse being determined depending on a logic state of the data and being selected from a group including a first program pulse having a positive polarity and a second program pulse having a negative polarity and having at least one of a peak level, a peak period, and a slew rate different from those of the first program pulse.

14. The method according to claim 13, wherein the first program pulse falls at a first slew rate, and the second program pulse rises at a second slew rate less than the first slew rate.

15. The method according to claim 14, wherein an absolute value of the peak level of the first program pulse is substantially the same as that of the peak level of the second program pulse.

16. The method according to claim 13, wherein the peak period of the first program pulse is substantially the same as that of the second program pulse.

17. The method according to claim 13, further comprising:
applying a read program pulse having the positive polarity to the selected memory cell.

18. The method according to claim 13, wherein each of the memory cells comprises a chalcogenide layer that maintains an amorphous state.

19. A semiconductor device, comprising:
a cell array including memory cells;
a voltage generator configured to generate a first program pulse having a positive polarity and a second program pulse having a negative polarity and having at least one of a peak level, a peak period, and a slew rate different from those of the first program pulse; and
a control logic circuit configured to receive data that is to be programmed into a memory cell selected from the memory cells, and to apply a program pulse to the selected memory cell to perform a program operation, the program pulse being determined depending on a logic state of the data and being selected from among the first and second program pulses.

20. The semiconductor device according to claim 19, wherein each of the memory cells comprises a chalcogenide layer that maintains an amorphous state.

* * * * *